United States Patent [19]

Küehn et al.

[11] Patent Number: 4,511,421
[45] Date of Patent: Apr. 16, 1985

[54] COMPONENT-INSERTION TABLE FOR MANUALLY EQUIPPING CIRCUIT CARRIERS

[75] Inventors: Volker Küehn, Pforzheim; Werner Rothfuss, Korntal-Munchingen; Richard Widmaier, Kornwestheim, all of Fed. Rep. of Germany

[73] Assignee: International Standard Electric Corporation, New York, N.Y.

[21] Appl. No.: 576,598

[22] Filed: Feb. 3, 1984

[30] Foreign Application Priority Data

Feb. 5, 1983 [DE] Fed. Rep. of Germany ....... 3303951

[51] Int. Cl.³ .............................................. B32B 31/00
[52] U.S. Cl. ....................................... 156/356; 29/739; 29/740; 29/759; 29/760; 156/379; 156/556
[58] Field of Search .................................. 29/739-742, 29/758-759, 760; 156/379, 358, 556-558, 356-357

[56] References Cited

U.S. PATENT DOCUMENTS

| | | | |
|---|---|---|---|
| 3,641,651 | 2/1972 | Rockwell et al. | 29/739 X |
| 3,715,258 | 2/1973 | Cunnane | 156/379 X |
| 4,447,945 | 5/1984 | Prisesak | 29/739 X |
| 4,458,412 | 7/1984 | Dean et al. | 29/740 X |
| 4,469,553 | 9/1984 | Whitehead | 156/379 X |

Primary Examiner—David Simmons
Attorney, Agent, or Firm—Donald J. Lenkszus

[57] ABSTRACT

A component-insertion table is provided with a receptacle (take-up device) for the circuit carrier, a programmable adhesive dosing feeder and a programmable component dispensing unit. The receptacle containing the circuit carrier is moved coordinately below a cover of the component-insertion table to a centrally located position for the automatic application of an adhesive with the aid of the adhesive dosing feeder, as well as into a centrally located insertion position for the manual placement of the components. The adhesive-application position and the insertion position be within a window in the cover through which the individual component insertion locations on the circuit carrier are made from above in a programmed order of succession.

8 Claims, 5 Drawing Figures

COMPONENT-INSERTION TABLE FOR MANUALLY EQUIPPING CIRCUIT CARRIERS

BACKGROUND OF THE INVENTION

The invention relates to a component-insertion table.

Requirements for economical manufacture, a higher packing density and smaller dimensions of electronic circuits are met by fabricating assemblies with leadless components, such a chips and MELFs (Metal Electrode Face Bonding). In accordance with these types of construction it is possible to manufacture active as well as passive components. Up to now, these components have chiefly been used with hybrid circuits. Considering that miniaturization continues to progress and that the optimum effect of integrated circuits is only achieved when the relevant passive components become smaller, the component manufacturers have developed similar types of passive components for insertion into printed circuit boards.

Due to the small number of components used on hybrid circuits (approximately 5 to 20 pieces), these components can be inserted by hand in accordance with a pattern. In the case of printed circuit boards, comprising large numbers of components, insertion according to a pattern appears unjustifiable because of high error rates. Therefore, adaptable insertion technologies have to be developed.

For manually equipping printed circuit boards with leadless components it is known to illuminate successively the insertion locations on a printed circuit board, which is clamped into the take-up device of a component-insertion table, with the aid of a programmed, moving light spot indicator. A manipulator provided with vacuum pincers takes a predetermined type of component out of a component bin and leads it past an adhesive dosing feeder by which it is wetted with adhesive in an automatically dosed amount. Thereafter, the component with the manipulator is moved by hand to the respective illuminated insertion location and is placed into position. (Company prospectus Royonic, November 1981). This component insertion method is suitable for small numbers, but has the disadvantage that the already positioned components are likely to be displaced by the operator in the subsequent component insertion processes.

A fully automatic component-placement machine is shown for equipping printed circuit boards with surface-mountable components in which, at an adhesive-application station, all locations for component insertion on a printed circuit board are first wetted with an adhesive in a programmed amount. Thereafter, the printed circuit board is transported to an equipping station where, with the aid of a so-called equipping head or component insertion head, components stored in magazines are automatically positioned in the respective insertion locations on the printed circuit board. At the same time, the next printed circuit board is supplied with adhesive at the adhesive-application station. The printed circuit boards are in a programmed and movable receptacle in which the printed circuit board positioned at the adhesive-application station and the printed circuit board positioned at the equipping station are respectively moved coordinately at the same time, and the congruent locations of insertion on both printed circuit boards are brought into the respective adhesive-application or component-insertion position. (Company prospectus Panasonic 8108). This component placement or insertion machine is suitable for inserting large numbers of components of the same type on a printed circuit board. With respect to small- and medium-lot production, however, this system cannot be used economically.

SUMMARY OF THE INVENTION

It is the object of the invention to provide a component-insertion table for inserting surface-mountable components into circuit carriers (pc boards and the like) which is capable of being economically used in small- and medium-lot production, and which permits a reliable manual equipping of the circuit carrier without endangering already positioned components.

A component-insertion table in accordance with the invention is provided with a receptacle (take-up device) for the circuit carrier, a programmable adhesive dosing feeder and a programmable component dispensing unit. The receptacle containing the circuit carrier is moved coordinately below a cover of the component-insertion table to a centrally located position for the automatic application of an adhesive with the aid of the adhesive dosing feeder, as well as into a centrally located insertion position for the manual placement of the components. The adhesive-application position and the insertion position be within a window in the cover through which the individual component insertion locations on the circuit carrier are made accessible from above in a programmed order of succession.

Because, in accordance with the invention, the insertion position always remains the same, improved ergonomic and physiological working conditions, result so that insertion errors can be avoided. Components which have already been positioned, are reliably protected by the cover. Due to the automatic application of adhesive, an increase in quality is obtained with regard to the positioning and amount of the adhesive which has a positive influence upon the quality of the soldered joints in subsequent soldering process.

BRIEF DESCRIPTION OF THE DRAWINGS

The invention will now be described with reference to two examples of embodiment of the invention shown in FIGS. 1 to 5 of the accompanying drawings, in which.

DETAILED DESCRIPTION

Figure 1:
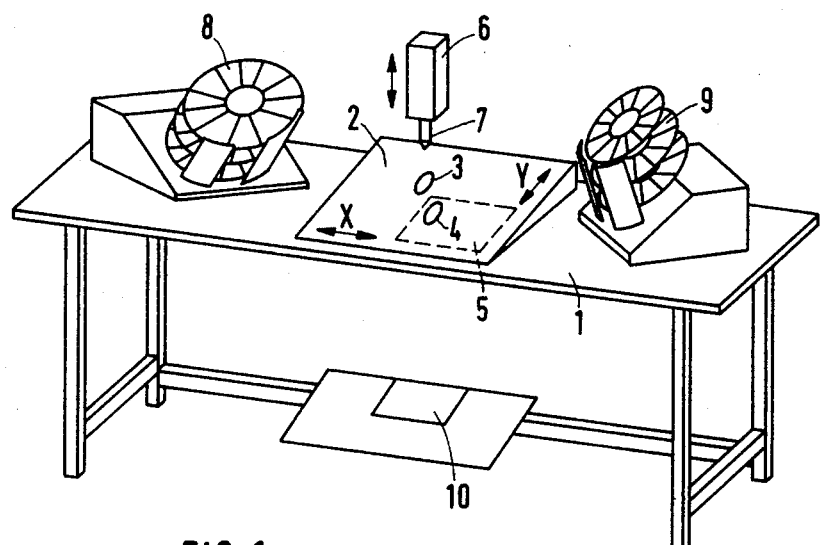
FIG. 1 shows a component-insertion table in a schematical three-dimensional representation.

FIG. 1 shows a component-insertion table 1 which, in the central area of its tabletop, is provided with a cover 2 of non-transparent material. At a central point, the cover 2 has two windows 3 and 4 which are staggered in relation to one another and each has a diameter of approximately 40 mm. Although, the windows 3 and 4 are of circular design, they may also have a rectangular or square shape. Below the cover 2, a circuit carrier 5 is positioned in a receptacle or take-up device (which is not shown) and which is coupled to a cross-slide mechanism with the aid of which the circuit carrier 5 is capable of being moved coordinately below the cover 2 of the component-insertion table, as is indicated by the two double arrows X and Y. The cover 2 has an ergonomically favorable inclination of about 15°, and the circuit carrier 5 is moved in a plane extending parallel in relation thereto. Vertically above the window 3 there is disposed an adhesive dosing feeder 6 whose application nozzle 7 is pointed at the center of the window 3. The adhesive application nozzle 7 can be lowered until coming in touch with the circuit carrier 5, and is spring-mounted in order to compensate for any possible vertical tolerances (warps) of the circuit carrier 5. On either side of the cover 2 on the component-insertion table 1 is positioned a circular component-dispenser unit 8 or 9, each of which is provided with three rotary circular shelves in the bins of which the components intended for insertion onto the circuit carrier 5 are kept ready in a programmed order of succession. A pedal switch 10 built into a footrest serves for stepping the component-insertion program.

Figure 2:
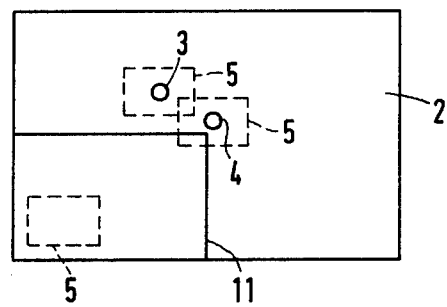
FIG. 2 is a top view of the cover of the component-insertion table of FIG. 1.

The individual operations required for equipping a circuit carrier 5 can best be explained with reference to FIG. 2. The cover 2 which is shown in a top view comprises a portion 11 which is capable of being tilted upwards, and which permits the circuit carrier to be inserted into the receptacle (take-up device) which is in its normal position. Following the start of the component-insert program, the circuit carrier 5, with the aid of the cross-slide mechanism, is automatically transported to the position in which the adhesive is applied, i.e., in such a way that the first component insertion location of the circuit carrier 5 appears vertically below the adhesive application nozzle 7 of the adhesive dosing feeder 6, in the center of the window 3. Now the adhesive application nozzle 7 is automatically lowered and the first drop of adhesive is placed on to the circuit carrier 5. This adhesive dosing feeder 6 is programmable with respect to the amount of adhesive as well as with respect to the number of adhesive drops per location of insertion, with the latter being provided for in case more than one drop of adhesive is required for certain sizes or types of components. In the following explanations and for the sake of simplicity, it is assumed that one drop of adhesive is used per component. After the first drop of adhesive has been applied, the circuit carrier 5 is automatically transported into the component-insertion position with the aid of the cross-slide mechanism, so that the first location of component insertion which is provided with the drop of adhesive, will appear in the center of the window 4. In the meantime, the operator has seized the component as supplied by one of the circular component-dispenser units 8 or 9 according to the program, and can place it on to the first location of insertion on the circuit carrier 5. By actuating the pedal switch 10, the program is now stepped, and the second location of component insertion on the circuit carrier 5 is brought into position for applying the adhesive below the window 3, and following the automatic application of the second drop of adhesive, is automatically transported into the component-insertion position below the window 4, where the second component is placed manually by the operator. These processes are repeated, with the circuit carrier 5 always being moved backwards and forwards between the position for applying the adhesive and the component-insertion position, until all locations of component insertion on the circuit carrier 5 are supplied with adhesive and equipped with the components. Thereafter, the receptacle (take-up device) resumes its normal position, and the first circuit carrier, following the tilting up of the portion 11, can be removed, thus permitting the next circuit carrier to be inserted.

Figure 3:
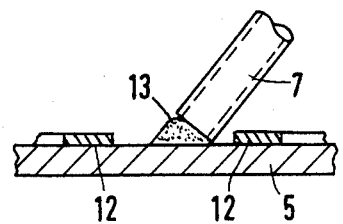
FIG. 3 shows in a side view part of a circuit carrier, on which a spot of adhesive is placed with the aid of an adhesive-application nozzle.

FIG. 3 shows part of a circuit carrier 5 comprising conductor leads 12 having bare connecting surfaces for leadless components. The adhesive application nozzle 7 has been lowered until it is in contact with the circuit carrier 5, and has applied a drop of adhesive 13. When the operation is carried out with the aid of the adhesive application nozzle 7 lowered onto the circuit carrier 5, the shown angle of inclination of the nozzle in relation to the plane of the circuit carrier 5, of about 50°, has proved particularly suitable for applying the drops of adhesive 13. The lifting direction of the adhesive application nozzle 7, however, extends vertically.

Figure 4:
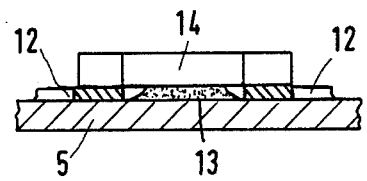
FIG. 4 is a side view of the circuit carrier of FIG. 3 with a component placed on to the spot of adhesive.

In FIG. 4, a component 14 is placed on the drop of adhesive 13, so that the connecting surfaces of the component 14 are on the bare connecting surfaces of the conductor leads 12. For the sake of completeness, it should be mentioned that a circuit carrier which is in such a way equipped with such components, is heated in an oven for the purpose of curing the adhesive, and that the circuit carrier, thereafter, passes through a soldering station in the course of which the connecting surfaces of the components and those of the circuit carrier are intimately connected to one another.

Figure 5:
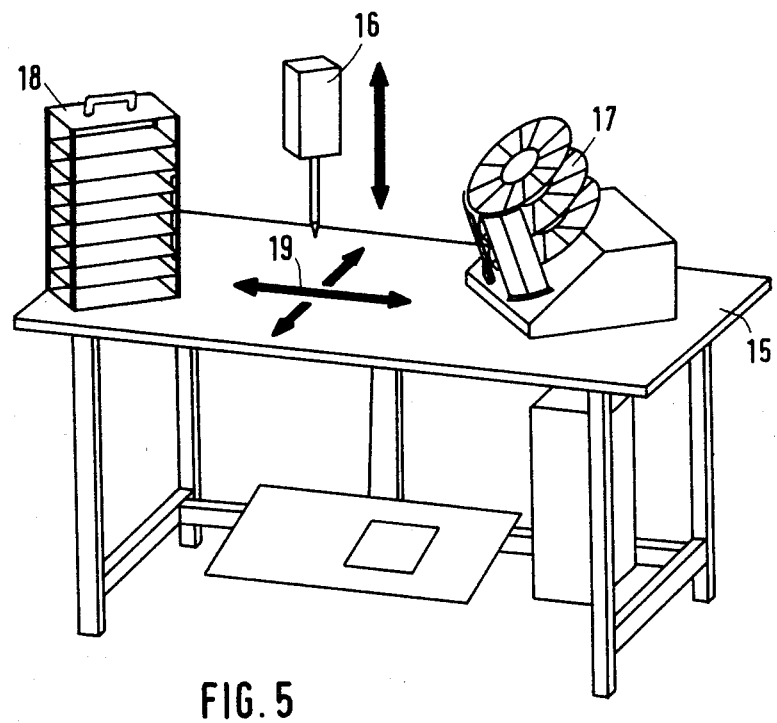
FIG. 5 is a perspective schematic view of a further type of component-insertion table.

FIG. 5 shows a further component-insertion table 15 in which the position for automatically applying the adhesive with the aid of the programmable adhesive dosing feeder 16, and the insertion position coincide. Therefore, the cover (not shown) of this table only comprises one window through which the application of the adhesive as well as the insertion of the components is carried out. For this purpose the adhesive dosing feeder 16 is lifted or swivelled to the side to such an extent that the operator is not prevented from working. On this component-insertion table 15, for example, there is only provided one circular component dispensing unit 17. To the left of the central working area of the table is a transporting container 18 in which the equipped circuit carriers are placed for transport to the curing oven. The double arrows 19 on the plane of the tabletop are indicative of the coordinate movement of the circuit carrier with the aid of the programmable cross-slide mechanism. The component-insertion table 15 as shown in FIG. 5 merely differs in its mode of operation from the component-insertion table 1 as described hereinbefore with reference to FIGS. 1 and 2, in that between the application of the adhesive and the manual equipping of a defined location of insertion, there is no further stepping for transporting the circuit carrier.

In both embodiments it has proved to be particularly favorable for the location of component insertion on the circuit carrier in the insertion position, to be spot illuminated with the aid of a stationary source of light. By illuminating the drop of adhesive, the location of insertion is clearly indicated to the operator, especially in cases where a colored adhesive is used or else, when a colorless adhesive is used, when the source of light itself is colored, as in the case of a laser light source. Moreover, in both embodiments, and in the close proximity of the central insertion position, that is, within the field of vision of the operator, there is disposed an indicating arrangement, for drawing the operator's attention to the proper position of insertion of polarized components, for example, with the aid of arrows illuminated in different directions.

What is claimed is:

1. A component-insertion table for manually equipping circuit carriers with surface mountable components comprising:
   a take up device for a circuit carrier;
   a programmable adhesive dosing feeder;
   a programmable component supply device;
   an insertion table cover having a window at a central insertion position;
   said take up device together with a circuit carrier being movable coordinately below said cover to a central position at which said feeder automatically applies adhesive;
   said take up device together with said circuit carrier being movable coordinately below said cover to said central insertion position at which individual component insertion locations on said circuit carrier are accessible from above in a programmed order of succession.

2. A component-insertion table in accordance with claim 1, wherein said central position and said central insertion position coincide.

3. A component-insertion table in accordance with claim 1, wherein said central position and said central insertion position are staggered relative to each other.

4. A component-insertion table in accordance with claim 1, comprising a cross-slide mechanism coupled to said take up device.

5. A component-insertion table in accordance with claim 1, wherein said cover comprises at least one part capable of being removed, tilted up or displaced for the purpose of inserting or removing said circuit carrier.

6. A component-insertion table in accordance with claim 1, wherein said adhesive dosing feeder is programmable with respect to the amount of adhesive as well as with respect to the number of adhesive-application points per location of insertion.

7. A component-insertion table in accordance with claim 1, comprising means for illuminating said circuit carrier at the insertion position with the aid of stationary light source.

8. A component-insertion table as claimed in accordance with claim 1, comprising a display or indicating device in the direct proximity of the central insertion position referring to the proper position for inserting polarized components.

* * * * *